US012682965B2

(12) United States Patent
Kim et al.

(10) Patent No.: US 12,682,965 B2
(45) Date of Patent: Jul. 14, 2026

(54) FLASH MEMORY REDUCING PROGRAM RISING TIME AND PROGRAM METHOD THEREOF

(71) Applicant: SAMSUNG ELECTRONICS CO., LTD., Suwon-si (KR)

(72) Inventors: Byungsoo Kim, Suwon-si (KR); Minseo Cha, Suwon-si (KR); Jin-Young Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 234 days.

(21) Appl. No.: 18/384,681

(22) Filed: Oct. 27, 2023

(65) Prior Publication Data

US 2024/0304263 A1     Sep. 12, 2024

(30) Foreign Application Priority Data

Mar. 10, 2023    (KR) ......................... 10-2023-0032026

(51) Int. Cl.
*G11C 16/34*         (2006.01)
*G11C 5/06*          (2006.01)
(Continued)

(52) U.S. Cl.
CPC .......... *G11C 16/3459* (2013.01); *G11C 5/063* (2013.01); *G11C 5/147* (2013.01); (Continued)

(58) Field of Classification Search
CPC ..... G11C 16/3459; G11C 5/063; G11C 5/147; G11C 8/08; G11C 11/4074; (Continued)

(56) References Cited

U.S. PATENT DOCUMENTS

| | | | |
|---|---|---|---|
| 8,638,606 B2 | 1/2014 | Zhao et al. | |
| 8,659,947 B2 | 2/2014 | Iwai et al. | |

(Continued)

OTHER PUBLICATIONS

Communication dated Jun. 10, 2024, issued by the European Patent Office in counterpart European Application No. 24161703.4.
(Continued)

*Primary Examiner* — Donald HB Braswell
(74) *Attorney, Agent, or Firm* — Sughrue Mion, PLLC

(57) ABSTRACT
The present disclosure provides methods and apparatuses for reducing a program voltage rising time. In some embodiments, a flash memory includes a memory cell array including a plurality of memory cells, a target voltage generator configured to adjust a target voltage level of a word line recovery voltage provided to the plurality of memory cells, and a word line voltage controller configured to provide recovery control signals for controlling the target voltage level of the word line recovery voltage. The target voltage generator is further configured to adjust the word line recovery voltage provided to a selected word line to the target voltage level, based on the recovery control signals provided during a word line recovery operation following a program verify operation, and to reduce a program voltage rising time in a program execution operation period of a next program loop by adjusting the target voltage level.

20 Claims, 13 Drawing Sheets

T100b

(51) Int. Cl.

| | |
|---|---|
| *G11C 5/14* | (2006.01) |
| *G11C 8/08* | (2006.01) |
| *G11C 11/4074* | (2006.01) |
| *G11C 16/04* | (2006.01) |
| *G11C 16/08* | (2006.01) |
| *G11C 16/12* | (2006.01) |
| *G11C 16/30* | (2006.01) |
| *G11C 16/32* | (2006.01) |

(52) U.S. Cl.
CPC ............ *G11C 8/08* (2013.01); *G11C 11/4074* (2013.01); *G11C 16/0483* (2013.01); *G11C 16/08* (2013.01); *G11C 16/12* (2013.01); *G11C 16/30* (2013.01); *G11C 16/32* (2013.01)

(58) Field of Classification Search
CPC ..... G11C 16/0483; G11C 16/08; G11C 16/12; G11C 16/30; G11C 16/32; G11C 16/10; G11C 16/3413
See application file for complete search history.

(56) References Cited

U.S. PATENT DOCUMENTS

| | | | |
|---|---|---|---|
| 8,854,894 | B2 | 10/2014 | Joo |
| 9,589,660 | B1 | 3/2017 | Hashimoto et al. |
| 9,761,313 | B2 | 9/2017 | Lee |
| 9,870,825 | B2 | 1/2018 | Nam et al. |
| 11,348,641 | B2 | 5/2022 | Shin et al. |
| 2009/0067247 | A1 | 3/2009 | Park et al. |
| 2018/0190363 | A1* | 7/2018 | Lee .................... G11C 16/3459 |
| 2021/0020254 | A1* | 1/2021 | Kim .................... G11C 16/3459 |
| 2021/0280262 | A1* | 9/2021 | Jeong ..................... G11C 16/26 |
| 2022/0270693 | A1 | 8/2022 | Kataoka |

OTHER PUBLICATIONS

Suh et al., "A 3.3 V 32 Mb NAND Flash Memory with Incremental Step Pulse Programming Scheme," IEEE Journal of Solid-State Circuits, vol. 30, No. 11, pp. 1149-1156, Nov. 1995, total 8 pages, XP002350549.

Kim et al., "Verify level control criteria for multi-level cell flash memories and their applications," EURASIP Journal on Advances in Signal Processing, vol. 2012, 2012, total 13 pages, XP093165429.

* cited by examiner

FIG.8

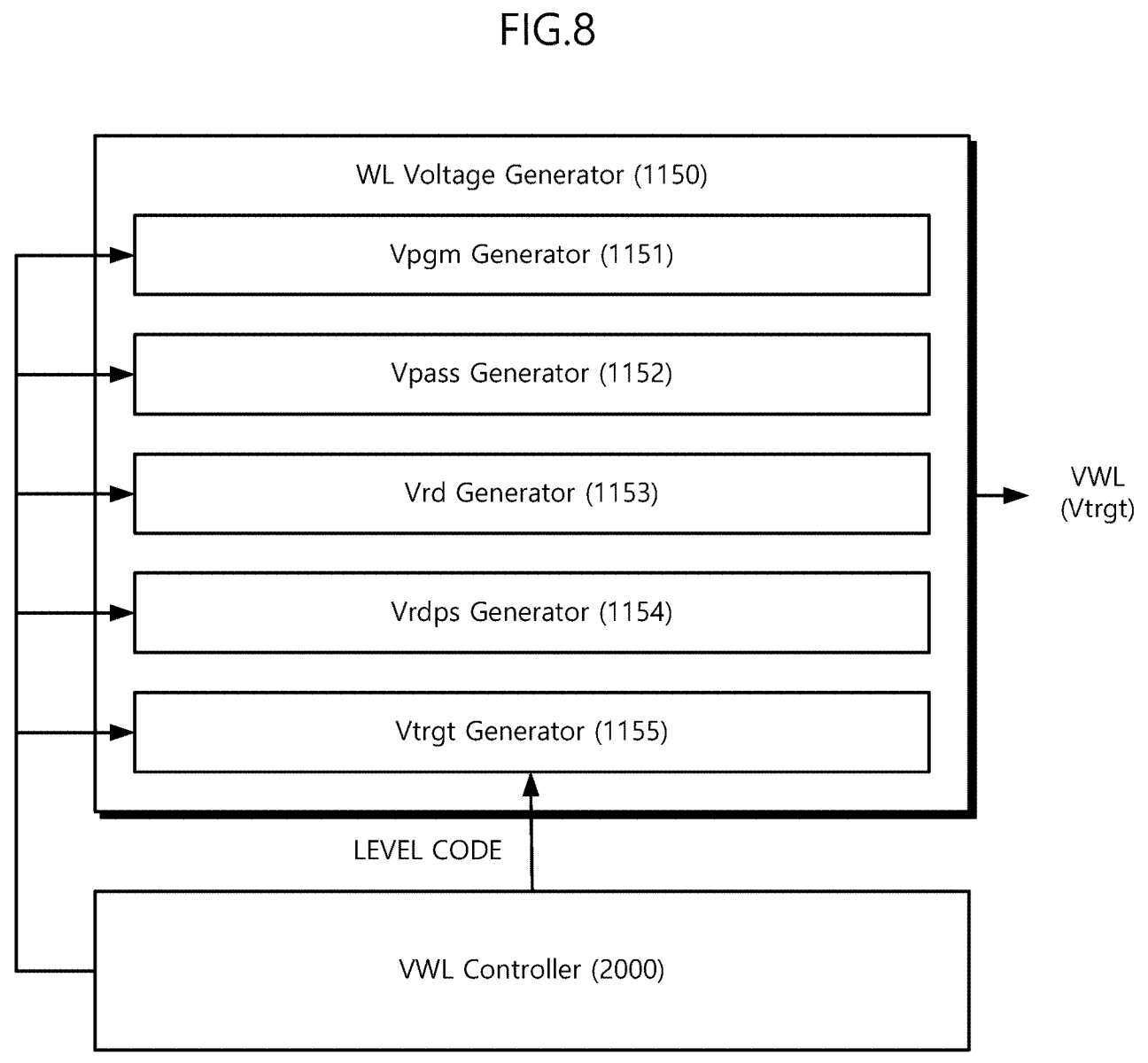

WL Voltage Generator (1150)

Vpgm Generator (1151)

Vpass Generator (1152)

Vrd Generator (1153)

Vrdps Generator (1154)

Vtrgt Generator (1155)

VWL
(Vtrgt)

LEVEL CODE

VWL Controller (2000)

FLASH MEMORY REDUCING PROGRAM RISING TIME AND PROGRAM METHOD THEREOF

CROSS-REFERENCE TO RELATED APPLICATIONS

This application claims benefit priority under 35 U.S.C. § 119 to Korean Patent Application No. 10-2023-0032026, filed on Mar. 10, 2023, in the Korean Intellectual Property Office, the disclosure of which is incorporated by reference herein in its entirety.

BACKGROUND

1. Field

The present disclosure relates generally to semiconductor memory devices, and more particularly, to a flash memory that reduces a program voltage rising time and a programming method thereof.

2. Description of Related Art

Semiconductor memories may be classified as a volatile memory and/or a non-volatile memory, for example. Typically, the volatile memories (e.g., a dynamic random access memory (DRAM), and a static random access memory (SRAM)) may exhibit faster read and/or write speeds when compared to the non-volatile memory. However, data stored in the volatile memory may disappear when a power applied to the volatile memory is turned off. Alternatively, the non-volatile memory may retain the data even when the power is turned off.

A representative example of the non-volatile memory may be and/or may include a flash memory. A representative flash memory may store multi-bit data of two or more bits in one memory cell. Alternatively or additionally, the flash memory may have at least one erase state and a plurality of program (e.g., writing) states depending on threshold voltage distributions.

According to a program operation, such as, but not limited to, an incremental step pulse programming (ISPP), the flash memory may repeat (e.g., sequentially perform) a plurality of program loops during the program operation. A program voltage and/or a program verify voltage may be applied during each program loop. As the program loop progresses, the applied program voltage may increase.

According to design constraints of a flash memory, the number of memory cells connected to one word line may increase. For example, the number of memory cells may increase from 8 kilobytes (KB) to 16 KB. However, resistance-capacitance (RC) loading may increase as the number of memory cells increases. For example, as the RC loading increases, memory cells that may be located farther away from the program voltage generator may take longer to reach the target program voltage. Accordingly, as the number of memory cells connected to the word line increases and/or the RC loading increases, the program voltage rising time may increase.

SUMMARY

Aspects of the present disclosure may provide a flash memory capable of reducing a program voltage rising time even when the number of memory cells connected to one word line increases and/or resistance-capacitance (RC) loading increases.

According to an aspect of the present disclosure, a flash memory is provided. The flash memory includes a memory cell array including a plurality of memory cells, a target voltage generator configured to adjust a target voltage level of a word line recovery voltage provided to the plurality of memory cells, and a word line voltage controller configured to provide recovery control signals for controlling the target voltage level of the word line recovery voltage. The target voltage generator is further configured to adjust the word line recovery voltage provided to a selected word line to the target voltage level, based on the recovery control signals provided during a word line recovery operation following a program verify operation. The target voltage generator is further configured to reduce a program voltage rising time in a program execution operation period of a next program loop by adjusting the target voltage level.

According to an aspect of the present disclosure, a flash memory is provided. The flash memory includes a memory cell array including a plurality of memory cells, a target voltage generator configured to adjust a target voltage level of a word line recovery voltage provided to the plurality of memory cells, and a word line voltage controller configured to provide recovery control signals for controlling the target voltage level of the word line recovery voltage. The target voltage generator is further configured to adjust the word line recovery voltage provided to a selected word line to the target voltage level based on the recovery control signals provided during a word line recovery operation following a program verify operation. The target voltage generator is further configured to provide, during a program execution operation period of a next program loop, at least one of a first voltage and a first supply time of at least one pass voltage to word lines adjacent to the selected word line and at least one of a second voltage and a second supply time of at least another pass voltage to remaining unselected word lines. The first voltage is different from the second voltage. The first supply time is different from the second supply time.

According to an aspect of the present disclosure, a program method of a flash memory is provided. The program method includes performing a program verify operation, a word line recovery operation after the program verify operation, and a program execution operation in a next program loop. The performing of the word line recovery operation includes reducing a program voltage rising time in a program execution operation period of the next program loop by controlling a target voltage level of a word line recovery voltage based on recovery control signals.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which:

FIG. 8 is a block diagram illustrating an example embodiment of the word line voltage generator and word line voltage controller shown in FIG. 2, according to an example embodiment of the present disclosure;

FIG. 10 is a timing diagram illustrating an embodiment of the program operation period T100 shown in FIG. 6, according to an example embodiment of the present disclosure;

DETAILED DESCRIPTION

Figure 1:
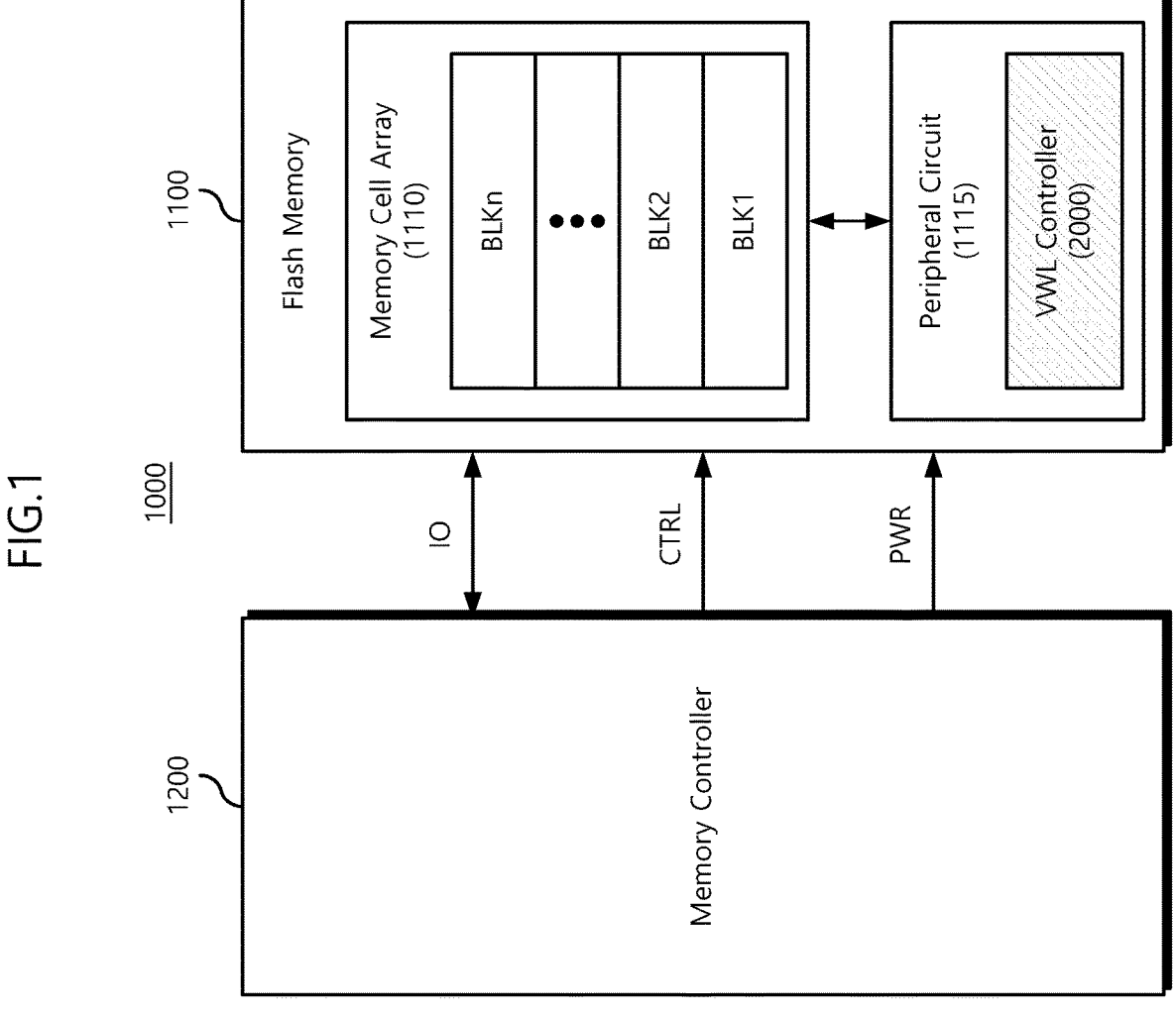
FIG. 1 is a block diagram illustrating a storage device, according to an example embodiment of the present disclosure.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

The embodiments herein may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

Hereinafter, various embodiments of the present disclosure are described with reference to the accompanying drawings.

FIG. 1 is a block diagram illustrating a storage device, according to an example embodiment of the present disclosure. The storage device 1000 may be and/or may include a flash storage device based on the flash memory 1100. For example, the storage device 1000 may be implemented as, but not limited to, a solid-state drive (SSD), an universal flash storage (UFS), a memory card, and the like.

Referring to FIG. 1, the storage device 1000 may include a flash memory 1100 and a memory controller 1200. In an embodiment, the flash memory 1100 may transmit and/or receive input/output signals IO to and/or from the memory controller 1200 through input/output lines. Alternatively or additionally, the flash memory 1100 may receive control signals CTRL through control lines. In an optional or additional embodiment, the flash memory 1100 may receive external power supply PWR through power lines. The storage device 1000 may store data in the flash memory 1100 under the control of the memory controller 1200.

The flash memory 1100 may include a memory cell array 1110 and a peripheral circuit 1115. The memory cell array 1110 may include a plurality of memory blocks (e.g., first memory block BLK1, second memory block BLK1, to n-th memory block BLKn, where n is a positive integer greater than zero (0), and hereinafter generally referred to as "BLK"). In an embodiment, each memory block BLK may have a vertical 3D structure. Alternatively or additionally, each memory block BLK may include a plurality of memory cells. In an optional or additional embodiment, multi-bit data may be stored in each memory cell.

The memory cell array 1110 may be located (e.g., disposed) next to and/or above the peripheral circuit 1115 in terms of the design layout structure. For example, a structure in which the memory cell array 1110 is positioned over the peripheral circuit 1115 may be referred to as a cell-on-peripheral (COP) structure.

In an embodiment, the memory cell array 1110 may be manufactured as a chip separate from the peripheral circuit 1115. For example, an upper chip including the memory cell array 1110 and a lower chip including the peripheral circuit 1115 may be connected to each other by a bonding method. Such a structure may be referred to as a chip-to-chip (C2C) structure.

The peripheral circuit 1115 may include analog circuits and/or digital circuits that may be needed to store data in the memory cell array 1110 and/or read data stored in the memory cell array 1110. The peripheral circuit 1115 may receive the external power PWR through power lines and may generate internal powers of various levels that may be provided to various components of the memory cell array 1110.

The peripheral circuit 1115 may receive commands, addresses, and/or data from the memory controller 1200 through input/output lines. For example, peripheral circuit 1115 may store data in the memory cell array 1110 according to the control signals CTRL. Alternatively or additionally, the peripheral circuit 1115 may read data stored in the memory cell array 1110 and provide the read data to the memory controller 1200.

The peripheral circuit 1115 may include a word line voltage (VWL) controller 2000. As the number of memory cells connected to one word line of the flash memory 1100 increases, a program voltage setup time may increase due to resistance-capacitance (RC) loading. During a program operation, the word line voltage controller 2000 may reduce a program voltage Vpgm setup time by adjusting a target voltage level of a word line recovery voltage between a program execution period and a program verify period. Consequently, a threshold voltage distortion that may occur due to an increase in program voltage setup time during a program operation may be reduced.

Figure 2:
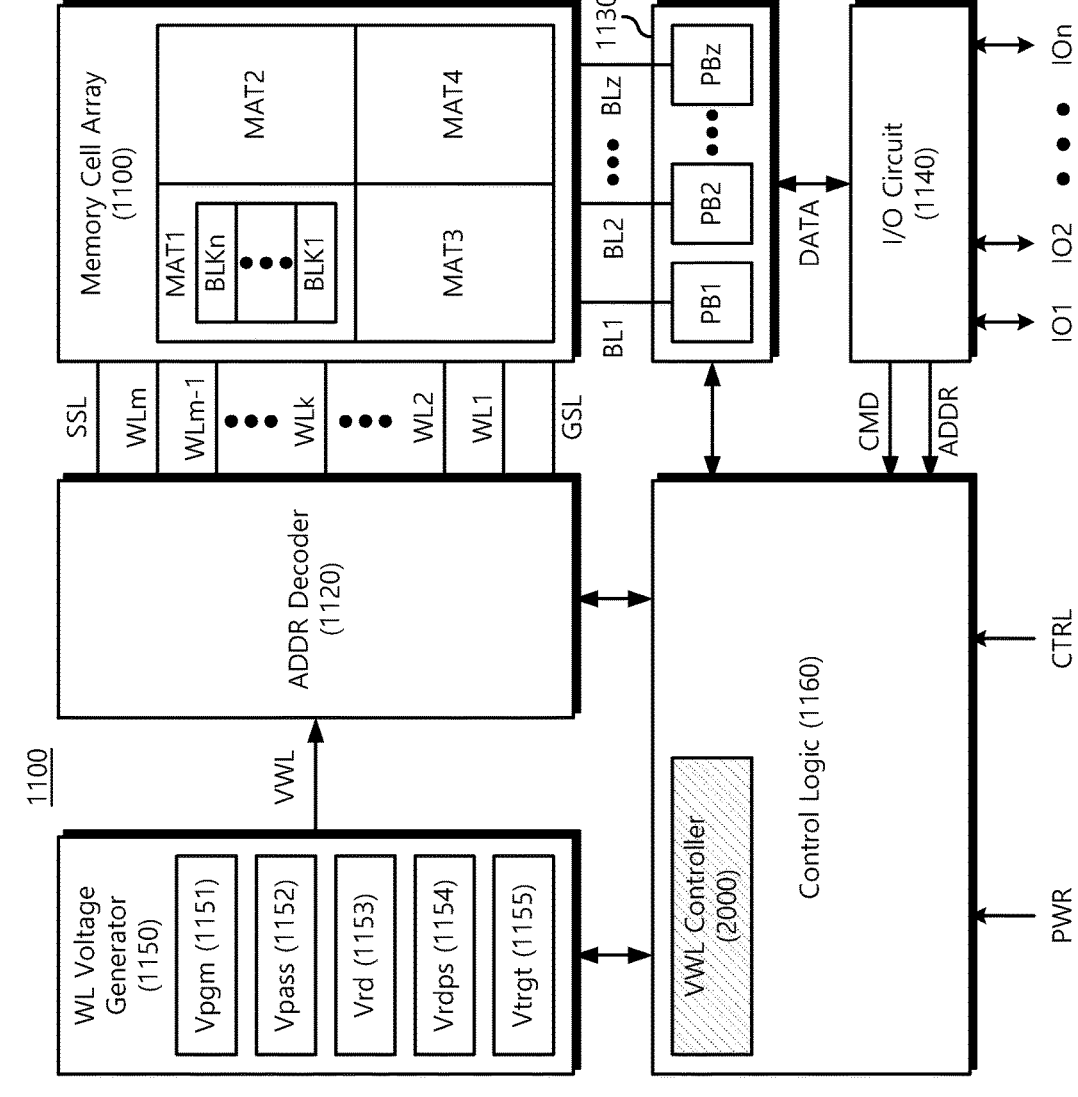
FIG. 2 is a block diagram illustrating an example embodiment of the flash memory illustrated in FIG. 1, according to an example embodiment of the present disclosure.

FIG. 2 is a block diagram illustrating an example embodiment of the flash memory illustrated in FIG. 1, according to an example embodiment of the present disclosure. Referring to FIG. 2, the flash memory 1100 may include a memory cell array 1110, an address decoder 1120, a page buffer circuit 1130, a data input/output (I/O) circuit 1140, a word line voltage generator 1150, and a control logic 1160.

The memory cell array 1110 may include a plurality of mats (e.g., first mat MAT1, second mat MAT2, third mat MAT3, and fourth mat MAT4). Each mat may include a plurality of memory blocks. For example, the first mat MAT1 may include the first memory block BLK1 to the n-th memory block BLKn. Each memory block may be composed of a plurality of pages. Each page may include a plurality of memory cells. Each memory cell may store multi-bit data (e.g., two or more bits). In an embodiment, each memory block may correspond to an erase unit. Alternatively or additionally, each page may correspond to a read and/or write unit.

The memory cell array 1110 may be formed in a direction perpendicular to a substrate. A gate electrode layer and/or an insulation layer may be alternately deposited on the substrate. Each memory block (e.g., first memory block BLK1) may be connected to one or more string selection lines SSL, a plurality of word lines (e.g., first word line WL1, second word line WL2, k-th word line WLk, to (m−1)th word line WLm−1, and m-th word line WLm, where k and m are positive integers greater than zero (0), and m is greater than k), and one or more ground selection lines GSL.

The address decoder 1120 may be connected to the memory cell array 1110 through the string selection lines SSL, the ground selection lines GSL, and the plurality of word lines WL1 to WLm. The address decoder 1120 may select a word line during a program operation and/or a read operation. In an embodiment, the address decoder 1120 may receive the word line voltage VWL from the word line voltage generator 1150 and may provide a program voltage and/or a read voltage to the selected word line.

The page buffer circuit 1130 may be connected to the memory cell array 1110 through a plurality of bit lines (e.g., first bit line BL1, second bit line BL2, to z-th bit line BLZ, where z is a positive integer greater than zero (0)). The page buffer circuit 1130 may temporarily store data to be stored in the memory cell array 1110 and/or data read from the memory cell array 1110. The page buffer circuit 1130 may include a plurality of page buffers (e.g., first page buffer PB1, second page buffer PB2, to z-th page buffer PBz) connected to respective bit lines of the plurality of bit lines BL1 to BLz. Each page buffer may include a plurality of latches to store and/or read multi-bit data.

The input/output (I/O) circuit 1140 may be internally connected to the page buffer circuit 1130 through data lines and/or may be externally connected to a memory controller (e.g., memory controller 1200 of FIG. 1) through a plurality of input/output lines (e.g., first I/O line IO1, second I/O line IO2, to n-th I/O line IOn, where n is a positive integer greater than zero (0)). The input/output circuit (I/O) 1140 may receive program data from the memory controller 1200 during a program operation. Alternatively or additionally, the input/output circuit (I/O) 1140 may provide data read from the memory cell array 1110 to the memory controller 1200 during a read operation.

The word line voltage generator 1150 may receive internal power from the control logic 1160. The word line voltage generator 1150 may generate a word line voltage VWL required to read and/or write data. The word line voltage VWL may be provided to a selected word line sWL and/or tp unselected word lines uWL through the address decoder 1120.

The word line voltage generator 1150 may include a program voltage (Vpgm) generator 1151, a pass voltage (Vpass) generator 1152, a read voltage (Vrd) generator 1153, a read pass voltage (Vrdps) generator 1154, and a target voltage (Vtrgt) generator 1155.

The program voltage (Vpgm) generator 1151 may generate a program voltage Vpgm that may be provided to the selected word line sWL during a program operation. The pass voltage generator (Vpass) 1152 may generate a pass voltage Vpass that may be provided to the unselected word lines uWL during a program operation. The read voltage (Vrd) generator 1153 may generate a selection read voltage Vrd that may be provided to the selected word line sWL during a read operation. The read pass voltage (Vrdps) generator 1154 may generate a read pass voltage Vrdps that may be provided to the unselected word lines uWL during a read operation. The read pass voltage Vrdps may be a voltage sufficient to turn on memory cells connected to the unselected word lines uWL during a read operation. The target voltage (Vtrgt) generator 1155 may adjust a target voltage Vtrgt of the word line recovery voltage during a program operation.

The control logic 1160 may control operations such as, but not limited to, read, write, and erase, of the flash memory 1100 using commands CMD, addresses ADDR, and control signals CTRL provided from the memory controller 1200. The addresses ADDR may include a block selection address for selecting one memory block, a row address for selecting one page, and/or a column address for selecting one memory cell.

The control logic 1160 may include the word line voltage controller 2000. The word line voltage controller 2000 may control the word line voltage VWL provided to the selected word line sWL and/or the unselected word lines uWL during a program operation. During the program operation, the word line voltage controller 2000 may reduce a program voltage setup time by adjusting a target voltage level of a word line recovery voltage between a program execution period and a program verify period. According to the present disclosure, threshold voltage distortion that may occur due to an increase in program voltage setup time during the program operation may be reduced.

Figure 3:
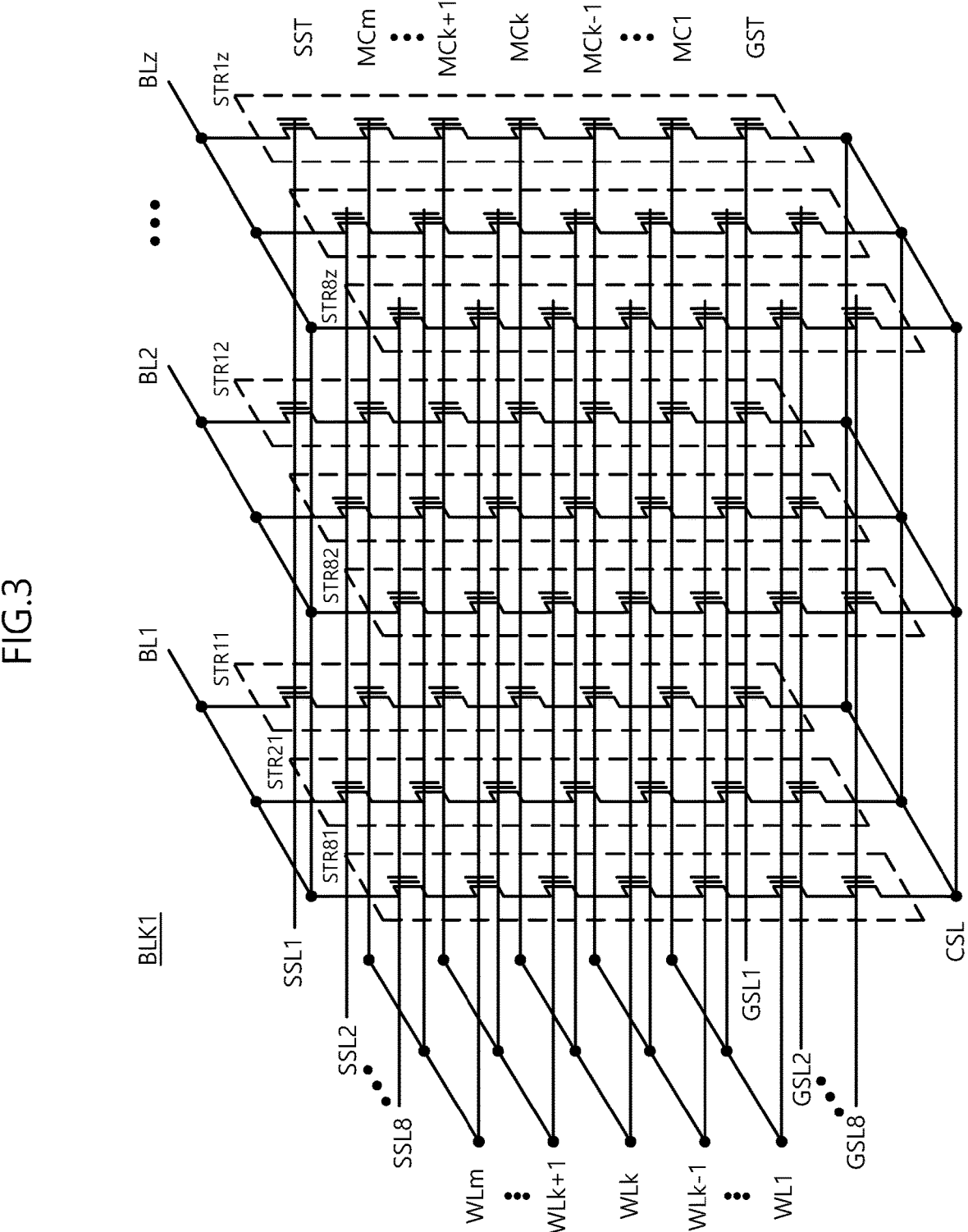
FIG. 3 is a circuit diagram illustrating an example embodiment of a memory block BLK1 of the memory cell array illustrated in FIG. 2, according to an example embodiment of the present disclosure.

FIG. 3 is a circuit diagram illustrating an example embodiment of a memory block BLK1 of the memory cell array illustrated in FIG. 2, according to an example embodiment of the present disclosure. Referring to FIG. 3, in the memory block BLK1, a plurality of cell strings STR11 to STR8z may be formed between the plurality of bit lines BL1 to BLz and a common source line CSL. Each cell string may include a string selection transistor SST, a plurality of memory cells (e.g., first memory cell MC1 to m-th memory cell MCm), and a ground selection transistor GST.

The string selection transistors SST may be connected with string selection lines SSL1 to SSL8. The ground selection transistors GST may be connected with ground selection lines GSL1 to GSL8. The string selection transistors SST may be connected with the plurality of bit lines BL1 to BLz, and the ground selection transistors GST may be connected with the common source line CSL.

The first to m-th word lines WL1 to WLm may be connected with the plurality of memory cells MC1 to MCm in a row direction. The first to z-th bit lines BL1 to BLz may be connected with the plurality of memory cells MC1 to MCm in a column direction. First to z-th page buffers PB1 to PBz may be connected with the first to z-th bit lines BL1 to BLZ.

The first word line WL1 may be placed (e.g., disposed) above the first to eighth ground selection lines GSL1 to GSL8. The first memory cells MC1 that are placed at the same height from the substrate may be connected with the first word line WL1. In a similar manner, the second to m-th memory cells MC2 to MCm that are placed at the same heights from the substrate may be respectively connected with the second to eighth word lines WL2 to WLm.

Figure 4:
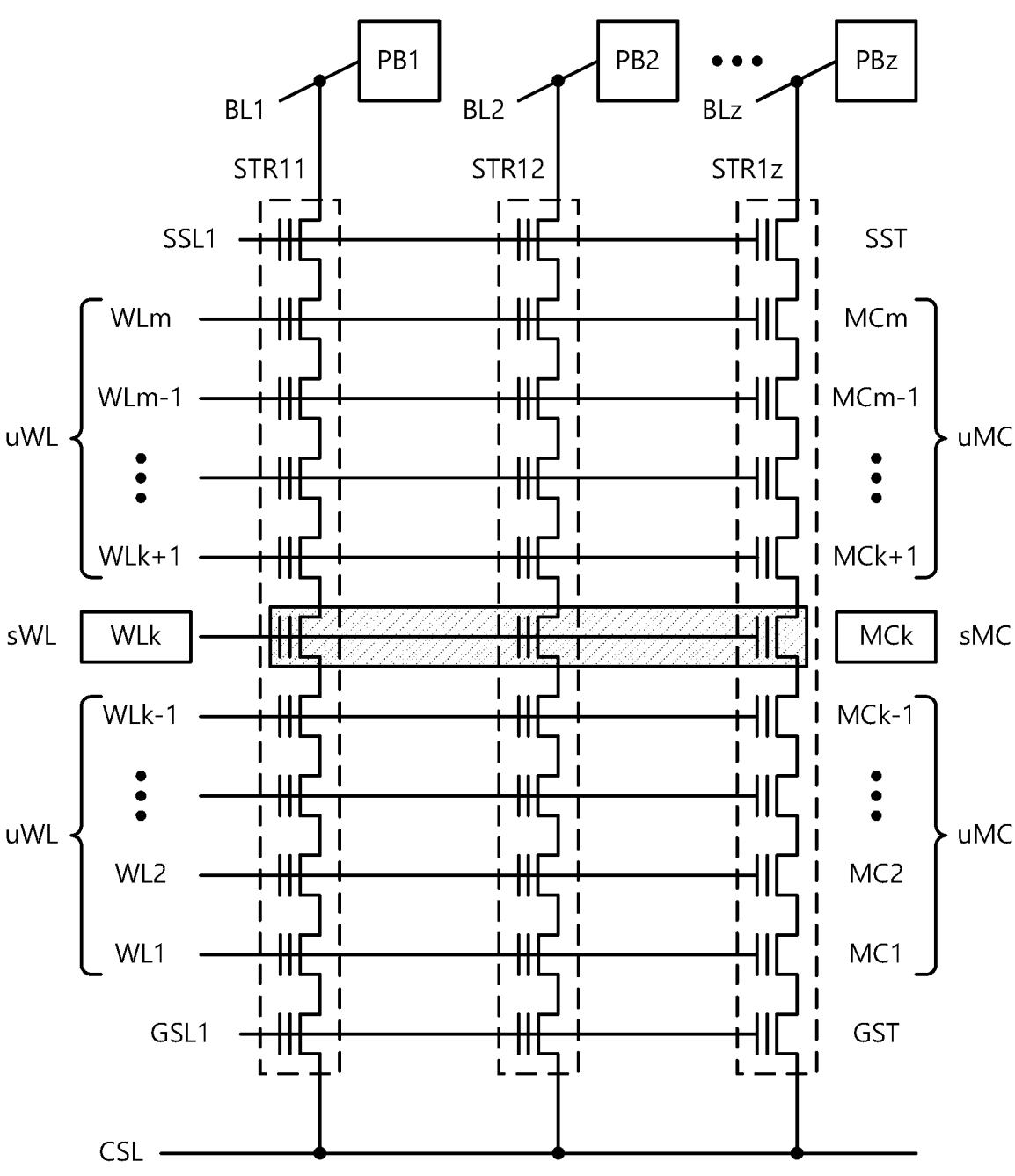
FIG. 4 is a circuit diagram illustrating cell strings selected by the first string selection line SSL1 from among the cell strings of the memory block BLK1 illustrated in FIG. 3, according to an example embodiment of the present disclosure.

FIG. 4 is a circuit diagram illustrating cell strings selected by the first string selection line SSL1 from among the cell strings of the memory block BLK1 illustrated in FIG. 3, according to an example embodiment of the present disclosure. The 11th to 1z cell strings STR11 to STR1z may be selected by the first string selection line SSL1. The 11th to 1z cell strings STR11 to STR1z may be connected to the first to z-th bit lines BL1 to BLZ, respectively. The first to z-th page buffers PB1 to PBz may be connected to the first to z-th bit lines BL1 to BLz, respectively.

The 11th cell string STR11 may be connected to the first bit line BL1 and the common source line CSL. The 11th cell string STR11 may include string selection transistors SST selected by the first string selection line SSL1, first to m-th memory cells MC1 to MCm connected to the first to m-th word lines WL1 to WLm, and ground selection transistors GST selected by the first ground selection line GSL1. The 12th cell string STR12 may be connected to the second bit line BL2 and the common source line CSL. The 1z-th cell string STR1z may be connected to the z-th bit line BLz and the common source line CSL.

The first word line WL1 and the m-th word line WLm may be referred to as edge word lines (e.g., edge WL). Alternatively or additionally, the second word line WL2 and the (m−1)-th word line WLm−1 may be referred to as edge adjacent word lines. In an embodiment, the k-th word line WLk may be a selected word line sWL. In such an embodiment, the (k−1)-th word line WLk−1 and the (k+1)-th word line WLk+1 may be referred to as adjacent word lines adjacent to the selected word line. If the k-th word line WLk is the selected word line sWL, the remaining word lines WL1 to WLk−1 and WLk+1 to WLm may be referred to as unselected word lines uWL.

The first memory cells MC1 and the m-th memory cells MCm may be referred to as edge memory cells. Alternatively or additionally, the second memory cells MC2 and the (m−1)-th memory cells MCm−1 may be referred to as edge adjacent memory cells. In an embodiment, the k-th memory cells MCk may be selected memory cells sMC. In such an embodiment, the (k−1)-th memory cells MCk−1 and the (k+1)-th memory cells MCk+1 may be referred to as memory cells adjacent to the selected memory cells (e.g., adjacent MC). If the k-th memory cells MCK are selected memory cells sMC, the remaining memory cells MC1 to MCk−1 and MCk+1 to MCm may be referred to as unselected memory cells uMC.

A set of memory cells selected by one string selection line and connected to one word line may be referred to as one page. For example, memory cells selected by the first string selection line SSL1 and connected to the k-th word line WLk may be one page. For example, eight pages may be configured on the k-th word line WLk. Among the eight pages, a page connected to the first string selection line SSL1 may be referred to as a selected page, and pages connected to the second to eighth string selection lines SSL2 to SSL8 may be referred to as unselected pages.

Figure 5:
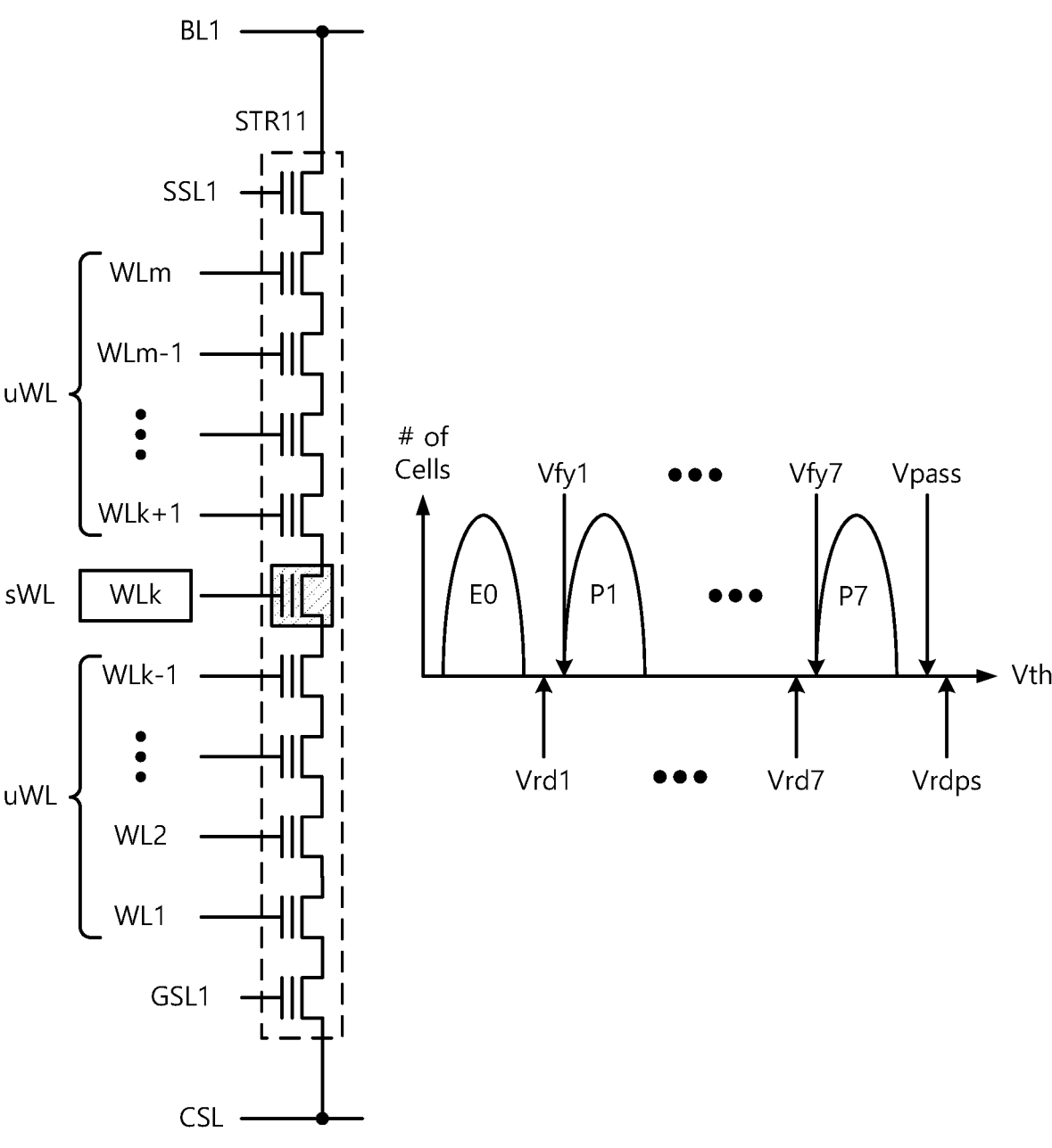
FIG. 5 is a diagram illustrating an example embodiment of threshold voltage distributions of memory cells illustrated in FIG. 4, according to an example embodiment of the present disclosure.

FIG. 5 is a diagram illustrating an example embodiment of threshold voltage distributions of memory cells illustrated in FIG. 4, according to an example embodiment of the present disclosure. The horizontal axis may represent the threshold voltage Vth, and the vertical axis may represent the number of memory cells.

Referring to FIG. 5, an example in which 3-bit data is stored in one memory cell is illustrated. A 3-bit memory cell may have one of eight states (E0, P1 to P7) according to the threshold voltage distribution. E0 may represent an erase state, and P1 to P7 may represent program states.

During a read operation, the selection read voltages Vrd1 to Vrd7 may be provided to the selected word line sWL, and the pass voltage Vps and/or the read pass voltage Vrdps may be provided to the unselected word lines uWL. The pass voltage Vps and/or the read pass voltage Vrdps may be a voltage sufficient to turn on the memory cells.

The first selection read voltage Vrd1 may be at a voltage level between the erase state E0 and the first program state P1. The second selection read voltage Vrd2 may be at a voltage level between the first and second program states P1 and P2. Similarly, the seventh selection read voltage Vrd7 may be at a voltage level between the sixth and seventh program states P6 and P7.

When the first selection read voltage Vrd1 is applied, the memory cell in the erase state E0 may be an on cell and the memory cell in the first to seventh program states P1 to P7 may be an off cell. When the second selection read voltage Vrd2 is applied, the memory cell in the erase state E0 and the first program state P1 may an on cell, and the memory cell in the second to seventh program states P2 to P7 may an off cell. Similarly, when the seventh selection read voltage Vrd7 is applied, the memory cell in the erase state E0 and the first to sixth program states P1 to P6 may be an on cell and the memory cell in the seventh program state P7 may be an off cell.

During a program operation, the flash memory 1100 may apply the pass voltage Vpass to all word lines, then maintain the pass voltage Vpass to the unselected word lines uWL, and apply the program voltage Vpgm to the selected word line sWL. After applying the program voltage Vpgm, the flash memory 1100 may provide program verify voltages Vfy1 to Vfy7 to verify whether the threshold voltage of the memory cell has reached a target level. The first program verify voltage Vfy1 may be a voltage for programming the memory cells to the first program state P1, and the seventh program verify voltage Vfy7 may be a voltage for programming the memory cells to the seventh program state P7.

Figure 6:
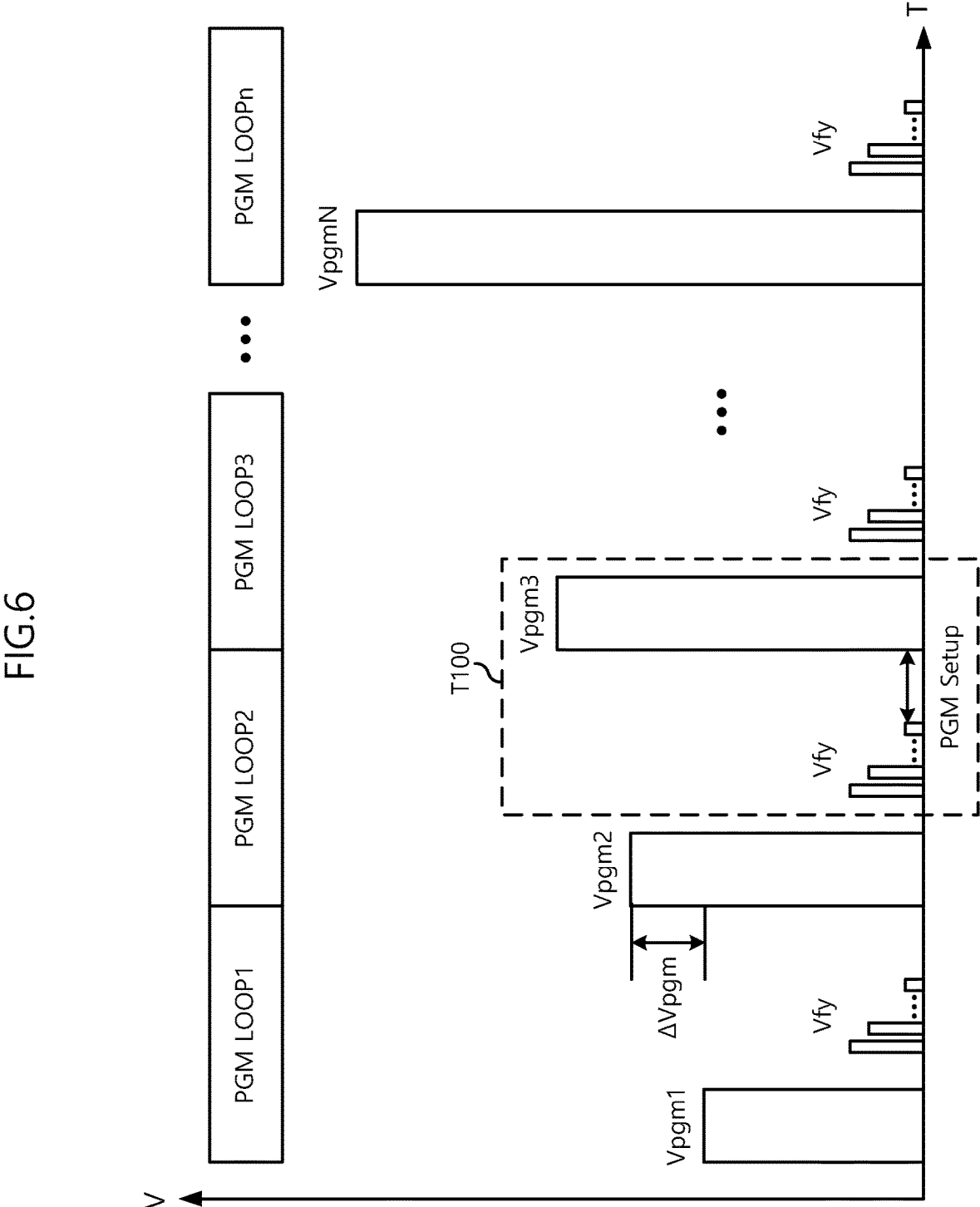
FIG. 6 is a graph illustrating a program operation of the flash memory shown in FIG. 2, according to an example embodiment of the present disclosure.

FIG. 6 is a graph illustrating a program operation of the flash memory shown in FIG. 2, according to an example embodiment of the present disclosure. Referring to FIG. 6, the flash memory 1100 may repeat a program loop, according to an incremental step pulse programming (ISPP) method, during the program operation, for example. In such an example, a program voltage Vpgm and/or a program verify voltage Vfy may be applied to each program loop. Alternatively or additionally, the program voltage Vpgm may increase by a predetermined level ΔVpgm as the program loop progresses.

As shown in FIG. 6, in the first program loop PGM LOOP1, the first program operation may be performed by the first program voltage Vpgm1 and the program verify voltage Vfy. In the second program loop PGM LOOP2, the second program operation may be performed by the second program voltage Vpgm2 and the program verify voltage Vfy. The second program voltage Vpgm2 may be higher than the first program voltage Vpgm1 by a predetermined voltage level AVpgm. In the third program loop PGM LOOP3, the third program operation may be performed by the third program voltage Vpgm3 and the program verify voltage Vfy. The third program voltage Vpgm3 may be higher than the second program voltage Vpgm2 by the predetermined voltage level ΔVpgm. Similarly, in the n-th program loop PGM LOOPn, the n-th program operation may be performed by the n-th program voltage VpgmN and the program verify voltage Vfy. The n-th program voltage VpgmN may be higher than a previous program voltage by the predetermined voltage level ΔVpgm.

As shown in FIG. 6, the applied program voltage Vpgm may increase by the program voltage increment ΔVpgm as the number of program loops increases. In an embodiment, memory cells passed in the program verify operation may be program inhibited in the next program loop. Alternatively or additionally, the page buffer circuit 1130 may store an indication of whether the memory cells pass or fail during the program verify operation.

A program setup operation may be performed between the program verify operation of the previous program loop (e.g., PGM LOOP2) and the program execution operation of the next program loop (e.g., PGM LOOP3). The program setup operation may include a word line recovery operation, a bit line setup operation, and a word line setup operation. Referring to the program operation period T100 shown in FIG. 6, the program setup operation PGM Setup may be performed in the second program loop PGM LOOP2 and the third program loop PGM LOOP3.

Figure 7:
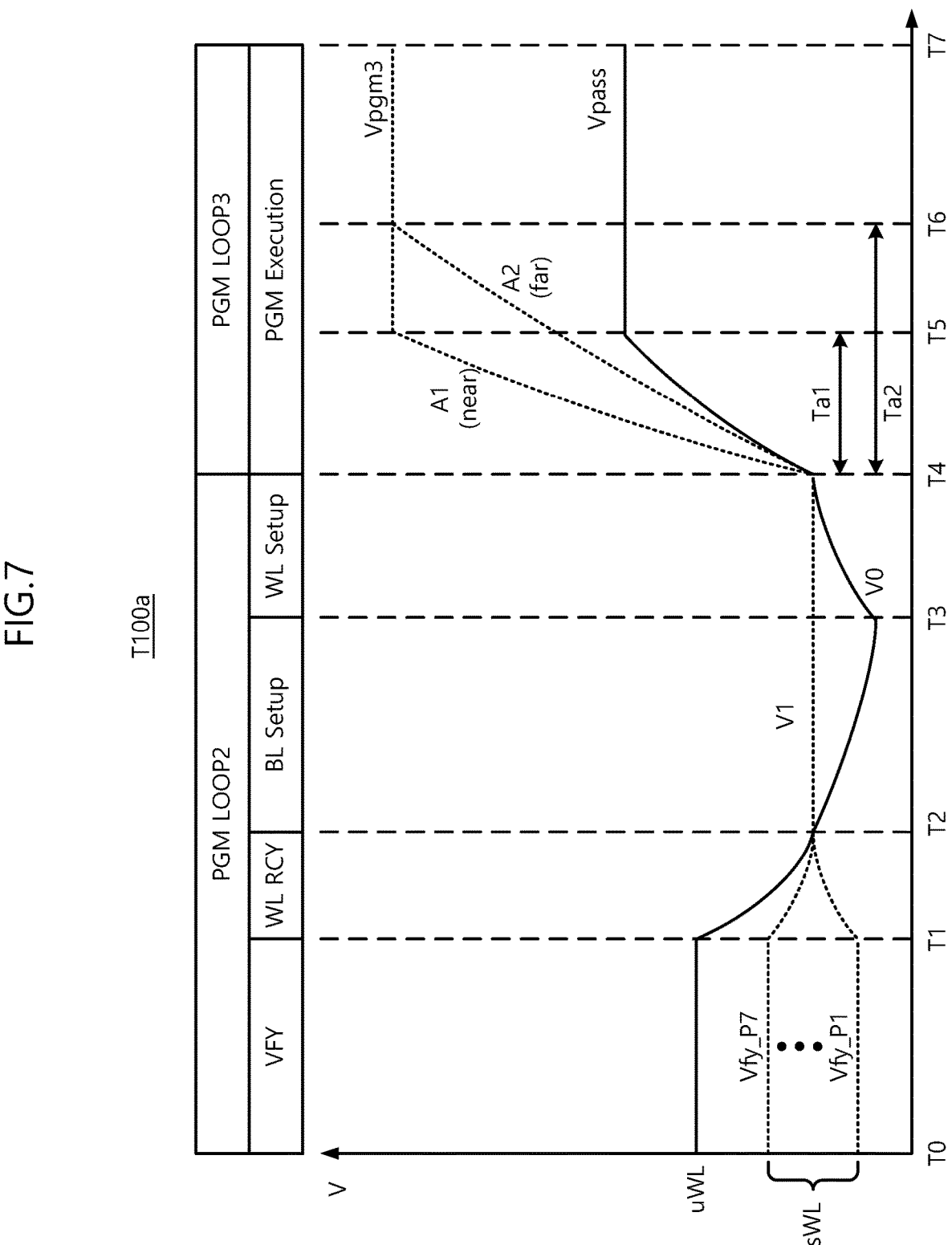
FIG. 7 is a timing diagram illustrating an embodiment of the program operation period T100 shown in FIG. 6, according to an example embodiment of the present disclosure.

FIG. 7 is a timing diagram illustrating an embodiment of the program operation period T100 shown in FIG. 6, according to an example embodiment of the present disclosure. Referring to FIG. 7, in the program operation period T100a, the program setup operation may be performed between the program verification operation VFY of the second program loop PGM LOOP2 and the program execution operation PGM Execution of the third program loop PGM LOOP3. The program setup operation may include a word line recovery operation (WL RCY), a bit line setup operation (BL Setup), and a word line setup operation (WL Setup).

During the program verify operation period T0 to T1 of the second program loop PGM LOOP2, verify voltages Vfy_P1 to Vfy_P7 for verifying the first to seventh program states P1 to P7 may be provided to the selected word line sWL. After the program verify operation (VFY) is performed, the program setup operation may be performed.

During the word line recovery operation period T1 to T2, the selected word line sWL and the unselected word lines uWL may be recovered to the first voltage V1. In the second program loop PGM LOOP2, the selected word line sWL may be provided with one of the verify voltages Vfy_P1 to Vfy_P7. The voltage level of the selected word line sWL may be the first voltage V1 in the word line recovery operation period T1 to T2.

During the bit line setup operation period T2 to T3, the selected word line sWL may maintain the first voltage V1, and the unselected word lines uWL may fall to the voltage V0 due to coupling or the like. During the word line setup operation period T3 to T4, the selected word line sWL may maintain the first voltage V1, and the unselected word lines uWL may rise to the first voltage V1 again.

In the program execution operation period (T4 to T7) of the third program loop (PGM LOOP3), the third program voltage Vpgm3 may be supplied to the selected word line sWL and the pass voltage Vpass may be applied to the unselected word lines uWL. Voltage levels of the selected word line sWL and the unselected word lines uWL may rise to the third program voltage Vpgm3 and the pass voltage Vpass during the period T4 to T5, respectively.

However, if the number of memory cells connected to one word line increases, RC loading may increase. If the RC loading increases, it may take more time for memory cells farther from the program voltage generator (Vpgm) 1151 to reach the third program voltage Vpgm3.

As shown in FIG. 7, A1 (near) shows that memory cells closest to the program voltage generator (Vpgm) 1151 may reach the third program voltage Vpgm3 faster than the A2 (far) memory cells that may be disposed farther away from the program voltage generator (Vpgm) 1151. That is, the closest memory cells may take Ta1 time (T5–T4), and the farthest memory cells may take Ta2 time (T6-T4), where Ta1 is shorter than Ta2.

When RC loading increases due to an increase in memory cells connected to the word line (e.g., from 8 kilobytes (KB) to 16 KB), the Ta2 time (T6–T4) may further increase. The flash memory 1100, according to an embodiment of the present disclosure, may control the level of the first voltage V1 in the program setup operation period, thereby reducing the program voltage rising time according to the RC loading increase.

FIG. 8 is a block diagram illustrating an example embodiment of the word line voltage generator and word line voltage controller shown in FIG. 2, according to an example embodiment of the present disclosure. Referring to FIG. 8, the word line voltage generator 1150 may include a program voltage (Vpgm) generator 1151, a pass voltage (Vpass) generator 1152, a read voltage (Vrd) generator 1153, a read pass voltage (Vrdps) generator 1154, and a target voltage (Vtrgt) generator 1155.

The program voltage (Vpgm) generator 1151 may generate a program voltage Vpgm that may be provided to the selected word line sWL during a program operation. The pass voltage generator (Vpass) 1152 may generate a pass voltage Vpass that may be provided to the unselected word lines uWL. The read voltage generator (Vrd) 1153 may generate a select read voltage Vrd that may be provided to the select word line sWL during a read operation. The read pass voltage generator (Vrdps) 1154 may generate a read pass voltage Vrdps that may be provided to the unselected word lines uWL. The target voltage (Vtrgt) generator 1155 may adjust the target voltage Vtrgt of the word line recovery voltage that may be provided to the selected word line sWL during a program operation. The target voltage Vtrgt may be variable.

A program operation of the flash memory 1100 may include at least one of a program verify operation period, a program setup operation period, and a program execution operation period. The word line voltage generator 1150 may provide the program verify voltage Vfy to the selected word line sWL during the program verify operation period. The word line voltage generator 1150 may provide a target voltage Vtrgt higher than the first voltage V1 of FIG. 7 to the selected word line sWL during the program setup operation period. The word line voltage controller 2000 may control a word line recovery voltage provided to the selected word line sWL during the program setup operation period.

The word line voltage controller 2000 may provide recovery control signals to the target voltage (Vtrgt) generator 1155. The recovery control signals may be and/or may include, but not be limited to, for example, LEVEL CODE. The word line voltage controller 2000 may adjust the word line recovery voltage of the selected word line sWL after the recovery operation by using the recovery control signals (e.g., LEVEL CODE). The flash memory 1100 may reduce a program voltage rising time, according to an increase in RC loading, by adjusting a word line recovery voltage.

Figure 9:
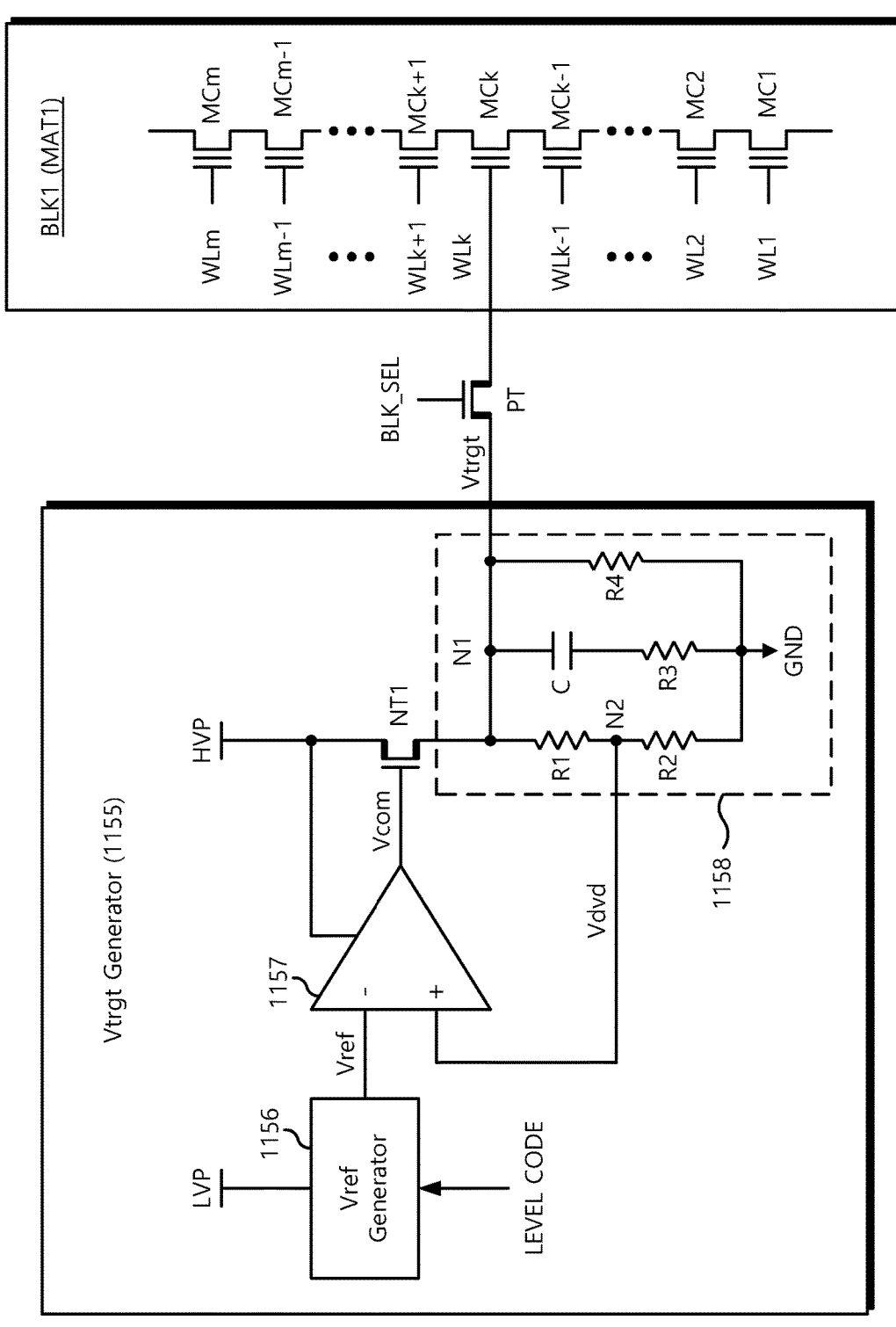
FIG. 9 is a block diagram illustrating an example embodiment of the target voltage generator shown in FIG. 8, according to an example embodiment of the present disclosure.

FIG. 9 is a block diagram illustrating an example embodiment of the target voltage generator shown in FIG. 8, according to an example embodiment of the present disclosure.

Referring to FIG. 9, the target voltage (Vtrgt) generator 1155 may be connected to the first memory block BLK1 of the first mat MAT1 through a block selection circuit. The block selection circuit may operate according to the block selection signal BLK_SEL. The block selection circuit may include a high voltage pass transistor PT.

The target voltage (Vtrgt) generator 1155 may include a first NMOS transistor NT1, a reference voltage (Vref) generator 1156, a comparator 1157, and a voltage divider 1158. A first NMOS transistor NT1 may be included between the first node N1 and the high voltage pump HVP. The first NMOS transistor NT1 may provide a high voltage to the first node N1 according to the output voltage of the comparator 1157. The first NMOS transistor NT1 may be a transistor having a high voltage durability.

The reference voltage (Vref) generator 1156 may receive power supply voltage from a low voltage pump LVP. The reference voltage generator (Vref) 1156 may receive the level code LEVEL CODE from the word line voltage controller 2000 and generate the reference voltage Vref. The reference voltage Vref may be changed according to the level code LEVEL CODE.

The comparator 1157 may receive power supply voltage from the high voltage pump HVP. The comparator 1157 may have a negative input terminal (–) and a positive input terminal (+). The comparator 1157 may receive the reference voltage Vref through the negative input terminal (–) and receive a divided voltage Vdvd through the positive input terminal (+). When the divided voltage Vdvd is higher than the reference voltage Vref, the comparator 1157 may output a comparison voltage Vcom sufficient to turn on the first NMOS transistor NT1. Alternatively or additionally, when the divided voltage Vdvd is lower than the reference voltage Vref, the comparator 1157 may output the comparison voltage Vcom that turns off the first NMOS transistor NT1.

The voltage divider 1158 may be connected between the first node N1 and the ground terminal GND. The voltage divider 1158 may have one or more current paths connected in parallel. The first to third current paths illustrated in FIG. 9 are shown as an example. That is, the present disclosure is not limited in this regard.

The first current path may include first and second resistors R1 and R2. The first resistor R1 may be connected between the first node N1 and the second node N2, and the second resistor R2 may be connected between the second node N2 and the ground terminal GND. The voltage divider 1158 may provide the divided voltage Vdvd to the comparator 1157 through the second node N2.

The second current path may be connected between the first node N1 and the ground terminal GND and may be connected in parallel with the first current path. The second current path may include a capacitor C and a third resistor R3. The capacitor C and the third resistor R3 may be connected in series. The third current path may be connected between the first node N1 and the ground terminal GND and may be connected in parallel with the second current path. The third current path may include a fourth resistor R4.

The target voltage (Vtrgt) generator 1155 may receive a high voltage (e.g., Vpass) from the high voltage pump HVP and adjust the word line recovery voltage of the selected word line sWL to the target voltage level during the program setup operation period. The target voltage Vtrgt may be higher (e.g., greater) than the first voltage V1 of FIG. 7.

In an embodiment, the target voltage Vtrgt level may vary according to the level code LEVEL CODE provided from the word line voltage controller 2000. In an optional or additional embodiment, the target voltage Vtrgt level may vary according to the resistance ratio of the voltage divider 1158. For example, the target voltage (Vtrgt) generator 1155 may adjust the target voltage Vtrgt level of the word line recovery voltage after the program verify operation. Alternatively or additionally, the target voltage (Vtrgt) generator 1155 may reduce the program voltage rising time due to the increase in RC loading.

Figure 10:
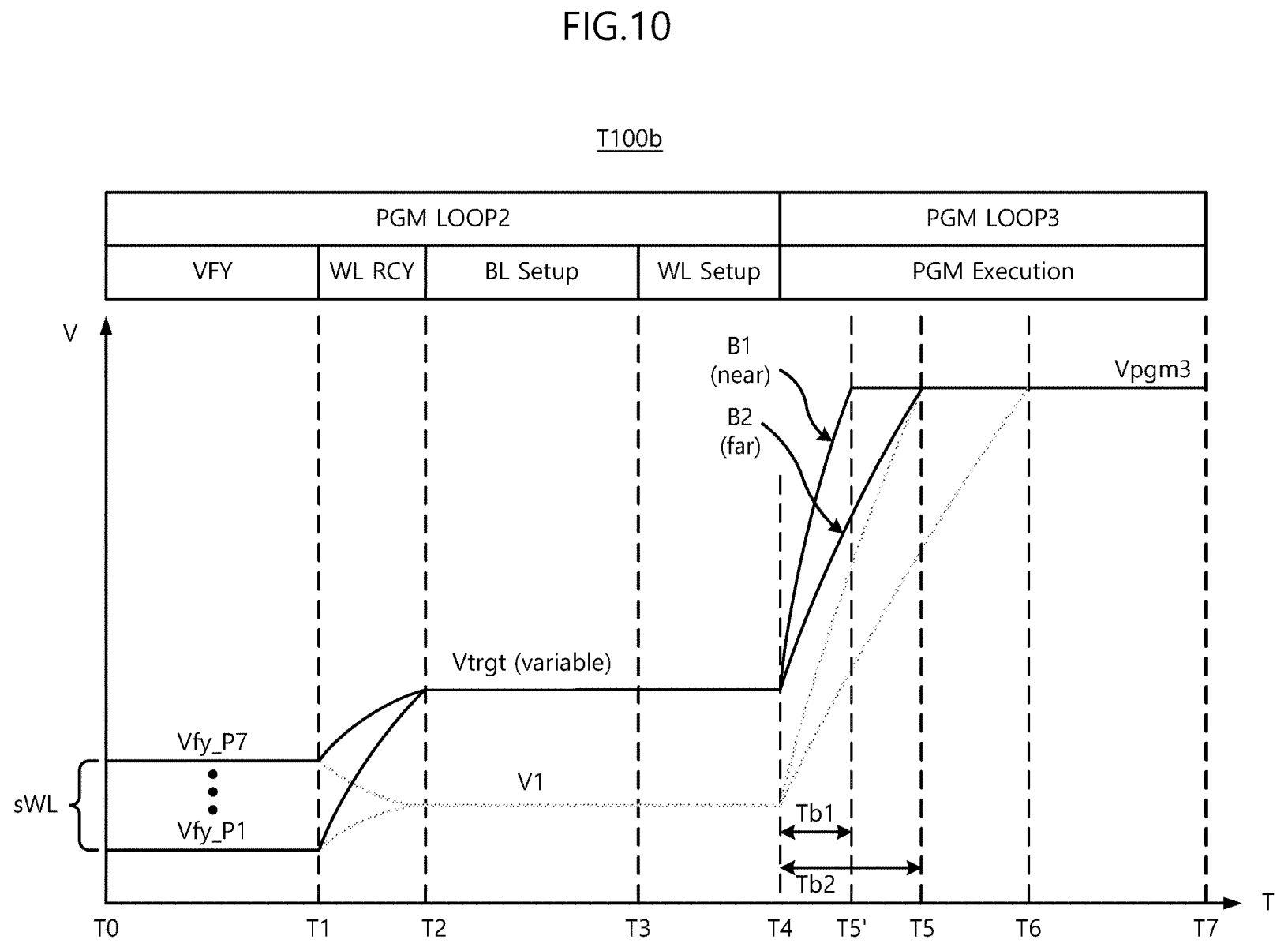

FIG. 10 is a timing diagram illustrating an embodiment of the program operation period T100 shown in FIG. 6, according to an example embodiment of the present disclosure. Referring to FIG. 10, in the program operation period T100b, a program setup operation may be performed between the program verify operation VFY of the second program loop PGM LOOP2 and the program execution operation PGM Execution of the third program loop PGM LOOP3. The program setup operation may include a word line recovery operation WL RCY, a bit line setup operation BL Setup, and a word line setup operation WL Setup.

In the program verify operation period T0 to T1 of the second program loop PGM LOOP2, program verify voltages Vfy_P1 to Vfy_P7 for verifying the first to seventh program states P1 to P7 may be provided to the selected word line sWL. After the program verify operation VFY is performed, the program setup operation may be performed.

In the word line recovery operation period T1 to T2, the selected word line sWL may be recovered with the target voltage Vtrgt higher than the first voltage V1. In the second program loop PGM LOOP2, the selected word line sWL may be provided with one of the verify voltages Vfy_P1 to Vfy_P7. The voltage level of the selected word line sWL may be the target voltage Vtrgt in the word line recovery operation period T1 to T2. In the bit line setup operation period T2 to T3 and the word line setup operation period T3 to T4, the voltage level of the selected word line sWL may maintain the target voltage Vtrgt.

In the program execution operation period T4 to T7 of the third program loop PGM LOOP3, the third program voltage Vpgm3 may be applied to the selected word line SWL. The voltage level of the selected word line sWL may increase to the third program voltage Vpgm3 during the period T4 to T5.

As shown in FIG. 10, B1 (near) shows that memory cells closest to the program voltage generator (Vpgm) 1151 may reach the third program voltage Vpgm3 faster that the B2 (far) memory cells that may be disposed farther away from the program voltage generator (Vpgm) 1151. That is, the closest memory cells may take Tb1 time (T5'–T4), and the farthest memory cells may take Tb2 time (T5–T4), where Tb1 is shorter than Tb2. According to the programming method of FIG. 7, it may take time T6 to T4 for the farthest memory cells to reach the third program voltage Vpgm3, as shown by a dotted line in FIG. 10. According to the program method of FIG. 10, the flash memory 1100 may take time T5 to T4 for the farthest memory cells to reach the third program voltage Vpgm3.

According to the program method of FIG. 10, the flash memory 1100 may adjust the word line recovery voltage to the target voltage Vtrgt in the program setup operation period, thereby reducing the program voltage rising time due to the increase in RC loading. The flash memory 1100 may vary the target voltage level according to the final verify voltage among program verify voltages Vfy_P1 to Vfy_P7 in the program verify operation period T0 to T1. Alternatively or additionally, the flash memory 1100 may vary the program setup time (e.g., T1 to T4) according to the final verify voltage.

The flash memory 1100 may adjust the target voltage level of the word line recovery voltage using the target voltage (Vtrgt) generator 1155. The word line voltage controller 2000 may provide the level code LEVEL CODE to the target voltage (Vtrgt) generator 1155 during the word line recovery operation. The target voltage (Vtrgt) generator 1155 may control the target voltage level of the word line recovery voltage provided to the selected word line sWL and/or the unselected word lines uWL during the word line recovery operation period.

The flash memory 1100 may differently set the program setup voltage (e.g., Vtrgt) according to program loops using the recovery voltage controller 2000. Alternatively or additionally, the flash memory 1100 may vary the program setup time (e.g., T1 to T4) according to the program loops. In an embodiment, the flash memory 1100 may set the program setup voltage and/or the program setup time differently according to the height of the selected word line sWL using the recovery voltage controller 2000.

Figure 11:
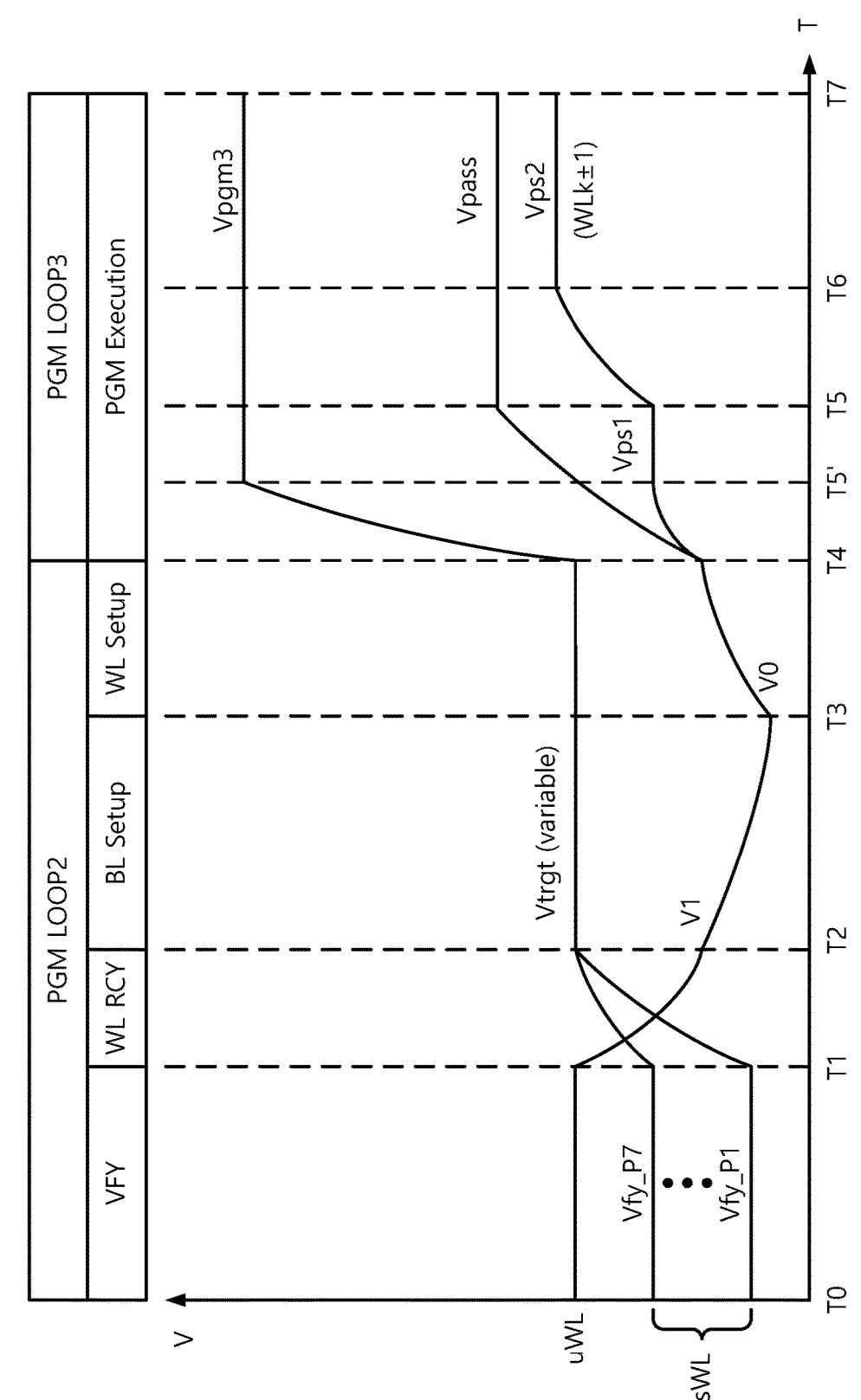
FIG. 11 is a timing diagram illustrating an embodiment of the program operation period T100 shown in FIG. 6, according to an example embodiment of the present disclosure.

FIG. 11 is a timing diagram illustrating an embodiment of the program operation period T100 shown in FIG. 6, according to an example embodiment of the present disclosure. Referring to FIG. 11, in the program operation period T100c, a program setup operation may be performed between the program verify operation VFY of the second program loop PGM LOOP2 and the program execution operation PGM Execution of the third program loop PGM LOOP3. The program setup operation may include a word line recovery operation WL RCY, a bit line setup operation BL Setup, and a word line setup operation WL Setup.

In the program verify operation period T0 to T1 of the second program loop PGM LOOP2, program verify voltages Vfy_P1 to Vfy_P7 for verifying the first to seventh program states P1 to P7 may be provided to the selected word line sWL. After the program verify operation VFY is performed, the program setup operation may be performed.

In the word line recovery operation period T1 to T2, the unselected word lines uWL may be recovered to a first voltage V1. The selected word line sWL may be recovered to the target voltage Vtrgt higher than the first voltage V1. In the bit line setup operation period T2 to T3, the selected word line sWL may maintain the target voltage Vtrgt. The voltage level of the unselected word lines uWL may be adjusted to the voltage V0. In the word line setup operation period T3 to T4, the voltage level of the selected word line sWL may maintain the target voltage Vtrgt. The voltage level of the unselected word lines uWL may be adjusted to the first voltage V1 again.

In the program execution operation period T4 to T7 of the third program loop PGM LOOP3, the third program voltage Vpgm3 may be applied to the selected word line sWL. The voltage level of the selected word line sWL may increase to the third program voltage Vpgm3 during the period T4 to T5.

The flash memory 1100 may adjust the word line recovery voltage to the target voltage Vtrgt in the program setup operation period. The flash memory 1100 may reduce the program voltage rising time due to the increase in RC loading. The flash memory 1100 may vary the program setup voltage or program setup time according to the final verify voltage of the program verify operation period T0 to T1. Alternatively or additionally, the flash memory 1100 may vary the program setup voltage and/or the program setup time according to the program loop and/or the height of the selected word line sWL.

The flash memory 1100 may separately control the adjacent word lines (e.g., WLk−1 and WLk+1) and the remaining unselected word lines uWL in the program execution period. In the pass voltage increasing period T4 to T5 of the unselected word lines uWL, the first pass voltage Vps1 may be applied to the adjacent word lines (e.g., WLk−1 and WLk+1). During the pass voltage maintaining period T5 to T7, the adjacent word lines (e.g., WLk−1 and WLk+1) may rise to the second pass voltage Vps2. The second pass voltage Vps2 may be lower and/or higher than the pass voltage Vpass. The flash memory 1100 may vary the voltage level or provision time of the first pass voltage Vps1 and/or the second pass voltage Vps2.

Figure 12:
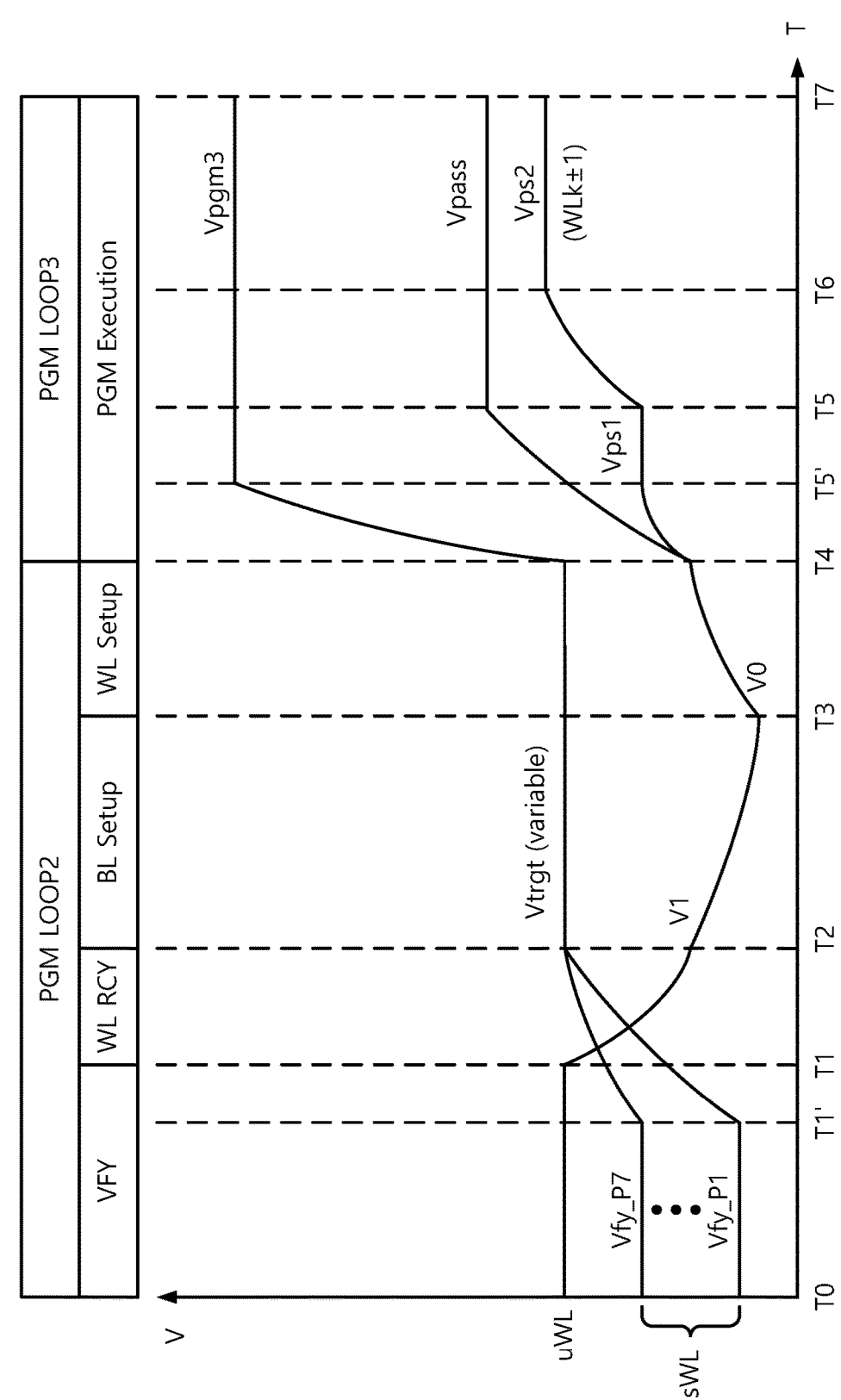
FIG. 12 is a timing diagram illustrating an embodiment of the program operation period T100 shown in FIG. 6, according to an example embodiment of the present disclosure.

FIG. 12 is a timing diagram illustrating an embodiment of the program operation period T100 shown in FIG. 6, according to an example embodiment of the present disclosure. Referring to FIG. 12, in the program operation period T100d, the flash memory 1100 may adjust the word line recovery voltage to the target voltage Vtrgt during the program setup operation period, thereby reducing the program voltage rising time according to the RC loading increase. The flash memory 1100 may vary the program setup voltage and/or program setup time according to the final verify voltage of the program verify operation period T0 to T1.

The flash memory 1100 may vary the program setup voltage and/or program setup time according to the program loop and/or the height of selected word line sWL. The flash memory 1100 may separately control the adjacent word lines (e.g., WLk−1 and WLk+1) and the remaining unselected word lines uWL in a program execution period. The flash memory 1100 may vary the voltage level and/or provision time of the first pass voltage Vps1 and/or the second pass voltage Vps2.

The flash memory 1100 may adjust the time for applying the word line recovery voltage to the selected word line sWL. Referring to FIG. 12, the flash memory 1100 may make the time point T1' at which the word line recovery voltage is applied to the selected word line sWL to be earlier than the time point T1 at which the word line recovery voltage is applied to the unselected word lines uWL. The flash memory 1100 may reduce overall program operation time by adjusting the timing T1' at which the word line recovery voltage is applied to the selected word line sWL.

Figure 13:
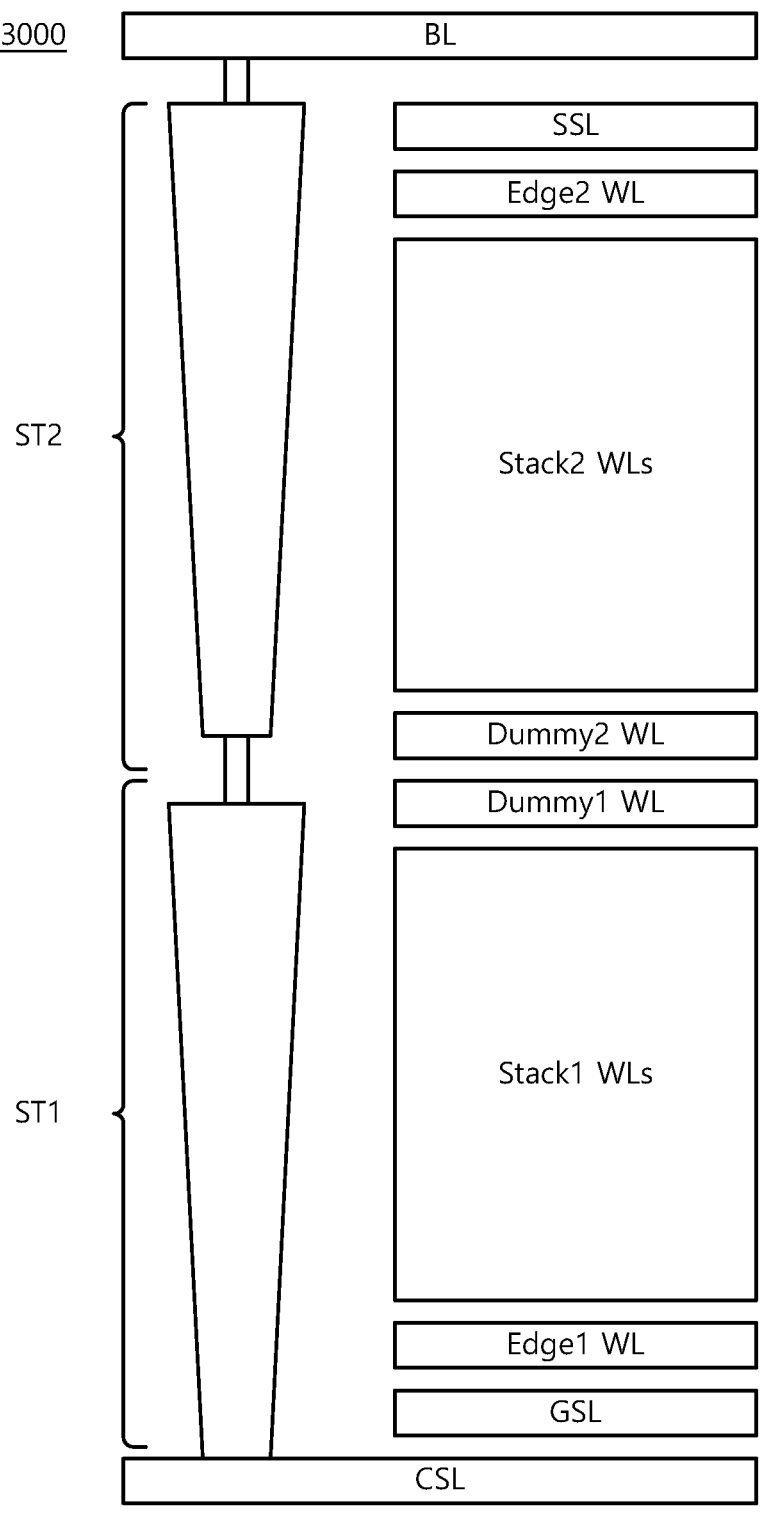
FIG. 13 is a diagram illustrating an example embodiment of a flash memory having a multi-stack structure, according to an example embodiment of the present disclosure.

FIG. 13 is a diagram illustrating an example embodiment of a flash memory having a multi-stack structure, according to an example embodiment of the present disclosure. The flash memory 3000 of FIG. 13 may include or may be similar in many respects to the flash memory 1100 described above with reference to FIGS. 1-12, and may include additional features not mentioned above.

Referring to FIG. 13, the flash memory 3000 may have a first stack ST1 and a second stack ST2. The first stack ST1 may be located at the bottom, and the second stack ST2 may be located at the top.

A pillar of the flash memory 3000 may be formed by bonding the first and second stacks ST1 and ST2. A plurality of dummy word lines (e.g., first dummy word line Dummy1 WL and second dummy word line Dummy2 WL) may be included at junctions of the first and second stacks ST1 and ST2. The first stack ST1 may be positioned between the common source line CSL and the first dummy word line Dummy1 WL. The second stack ST2 may be positioned between the second dummy word line Dummy2 WL and the bit line BL.

The first stack ST1 may include a ground selection line GSL, a first edge word line Edge1 WL, and first stack word lines Stack1 WLs. The second stack ST2 may include second stack word lines Stack2 WLs and second edge word lines Edge2 WL. Memory cells connected to the first and second edge word lines Edge1 WL and Edge2 WL may store bit data different from the other memory cells. For example, memory cells connected to the first and second edge word lines Edge1 WL and Edge2 WL may be single-level cells (SLC) and/or multi-level cells (MLC). Alternatively or additionally, memory cells connected to the other word lines may be triple-level cells (TLC) and/or quadruple-level cells (QLC).

During a program operation, the flash memory 3000 may differently control the word line recovery voltage according to the height of the word line. For example, the flash memory 3000 may reduce a program voltage rising time by adjusting a program setup voltage and/or a program setup time according to a position of stacks and/or a height of the selected word line within a stack during the word line recovery operation.

While the present disclosure has been described with reference to embodiments thereof, it may be apparent to those of ordinary skill in the art that various changes and modifications may be made thereto without departing from the spirit and scope of the present disclosure as set forth in the following claims.

What is claimed is:

1. A flash memory, comprising:
a memory cell array comprising a plurality of memory cells;
a target voltage generator configured to adjust a target voltage level of a word line recovery voltage provided to the plurality of memory cells; and
a word line voltage controller configured to provide recovery control signals for controlling the target voltage level of the word line recovery voltage,
wherein the target voltage generator is further configured to:
adjust the word line recovery voltage provided to a selected word line to the target voltage level, based on the recovery control signals provided during a word line recovery operation following a program verify operation;
adjust the target voltage level of the word line recovery voltage during the word line recovery operation; and
reduce a program voltage rising time in a program execution operation period of a next program loop by adjusting the target voltage level, and
wherein a previous program voltage rising time of a previous program loop is greater than the program voltage rising time of the program execution operation period of the next program loop.

2. The flash memory of claim 1, wherein the target voltage generator is further configured to:
adjust the target voltage level of the word line recovery voltage, according to a final verify voltage level of the program verify operation.

3. The flash memory of claim 1, wherein the target voltage generator is further configured to:
adjust the target voltage level of the word line recovery voltage, according to a height of the selected word line.

4. The flash memory of claim 1, wherein the target voltage generator is further configured to:
adjust the target voltage level of the word line recovery voltage, according to program loops.

5. The flash memory of claim 4, wherein the target voltage generator is further configured to:
adjust a time for maintaining the target voltage level of the word line recovery voltage, according to the program loops.

6. The flash memory of claim 1, wherein the target voltage generator is further configured to:

provide word lines adjacent to the selected word line with at least one of a first voltage and a first supply time of at least one pass voltage; and provide remaining unselected word lines with at least one of a second voltage and a second supply time of at least another pass voltage, wherein the first voltage is different from the second voltage, wherein the first supply time is different from the second supply time.

7. The flash memory of claim 6, wherein the target voltage generator is further configured to:

apply a first pass voltage to adjacent word lines during a rising period of the at least another pass voltage provided to the remaining unselected word lines; and apply a second pass voltage to the adjacent word lines during a maintaining period of the at least another pass voltage provided to the remaining unselected word lines, wherein the second pass voltage is higher than the first pass voltage.

8. The flash memory of claim 7, wherein the second pass voltage is different from the at least another pass voltage provided to the remaining unselected word lines.

9. The flash memory of claim 1, wherein the target voltage generator is further configured to:

adjust a first supply time of the word line recovery voltage applied to the selected word line.

10. The flash memory of claim 9, wherein the first supply time of the word line recovery voltage of the selected word line occurs at an earlier time point than a second supply time of the word line recovery voltage of remaining unselected word lines.

11. A program method of a flash memory comprising a memory cell array comprising a plurality of memory cells, the program method comprising:

adjusting a target voltage level of a word line recovery voltage provided to the plurality of memory cells; and providing recovery control signals for controlling the target voltage level of the word line recovery voltage, wherein the adjusting the target voltage level comprises:

adjusting the word line recovery voltage provided to a selected word line to the target voltage level, based on the recovery control signals provided during a word line recovery operation following a program verify operation;

adjusting the target voltage level of the word line recovery voltage during the word line recovery operation; and reducing a program voltage rising time in a program execution operation period of a next program loop by adjusting the target voltage level, and wherein a previous program voltage rising time of a previous program loop is greater than the program voltage rising time of the program execution operation period of the next program loop.

12. The program method of claim 11, wherein the target voltage level of the word line recovery voltage is adjusted according to a final verify voltage level of the program verify operation.

13. The program method of claim 11, wherein the target voltage level of the word line recovery voltage is adjusted according to a height of the selected word line.

14. The program method of claim 11, wherein the target voltage level of the word line recovery voltage is adjusted according to program loops.

15. The program method of claim 14, further comprising adjusting a time for maintaining the target voltage level of the word line recovery voltage according to the program loops.

16. The program method of claim 11, further comprising:

providing word lines adjacent to the selected word line with at least one of a first voltage and a first supply time of at least one pass voltage; and providing remaining unselected word lines with at least one of a second voltage and a second supply time of at least another pass voltage, wherein the first voltage is different from the second voltage, wherein the first supply time is different from the second supply time.

17. The program method of claim 16, further comprising:

applying a first pass voltage to adjacent word lines during a rising period of the at least another pass voltage provided to the remaining unselected word lines; and applying a second pass voltage to the adjacent word lines during a maintaining period of the at least another pass voltage provided to the remaining unselected word lines, wherein the second pass voltage is higher than the first pass voltage.

18. The program method of claim 17, wherein the second pass voltage is different from the at least another pass voltage provided to the remaining unselected word lines.

19. The program method of claim 11, further comprising adjusting a first supply time of the word line recovery voltage applied to the selected word line.

20. The program method of claim 19, wherein the first supply time of the word line recovery voltage of the selected word line occurs at an earlier time point than a second supply time of the word line recovery voltage of remaining unselected word lines.

* * * * *